United States Patent
Kim et al.

(10) Patent No.: US 8,044,710 B2
(45) Date of Patent: Oct. 25, 2011

(54) FILTER CUT-OFF FREQUENCY CORRECTION CIRCUIT

(75) Inventors: Sinn-Young Kim, Seongnam (KR); Chang-Sik Yoo, Goori (KR)

(73) Assignee: FCI Inc., Gyeonggi-do (KR)

( * ) Notice: Subject to any disclaimer, the term of this patent is extended or adjusted under 35 U.S.C. 154(b) by 0 days.

(21) Appl. No.: 12/684,876

(22) Filed: Jan. 8, 2010

(65) Prior Publication Data

US 2011/0169591 A1    Jul. 14, 2011

(51) Int. Cl.
*H03K 5/00*    (2006.01)
(52) U.S. Cl. .......................................... 327/552; 327/34
(58) Field of Classification Search .......... 327/551–559, 327/34
See application file for complete search history.

(56) References Cited

U.S. PATENT DOCUMENTS

| | | | | |
|---|---|---|---|---|
| 5,245,646 | A | * | 9/1993 | Jackson et al. ................... 377/2 |
| 5,416,438 | A | * | 5/1995 | Shibata ......................... 327/552 |
| 6,628,163 | B2 | * | 9/2003 | Dathe et al. ................... 327/553 |

* cited by examiner

*Primary Examiner* — Dinh T. Le (57) ABSTRACT

A filter cut-off frequency correction circuit, inputted with a step function increasing from a first voltage to a second voltage, comprises a linear passive filter, for integrating the step function to obtain a third voltage; a first comparator, outputting a first high-level signal when the third voltage is greater than a first predetermined reference voltage; a second comparator, outputting a second high-level signal in a first period from the time that the second voltage is applied to the time that the first comparator outputs the first high-level signal; a counter, for counting a number of clock pulses of a reference clock inputted in the first period; a digital block, for calculating a variation rate of time constant according to the number of clock pulses of the reference clock, and generating a correction code; and a filter, for correcting the cut-off frequency according to the correction code. The correction circuit can improve the speed of cut-off frequency adjustment.

8 Claims, 9 Drawing Sheets

| Target (MHz) | Tuning Freq. (MHz) | C1(pF) | Switch | C2(pF) | C3(pF) |
|---|---|---|---|---|---|
|  | 24.4 | 0.498 | x | 0.596 | 0.858 |
| 18.3 | 18.3 | 0.665 | 1 | 0.795 | 1.145 |
|  | 12.2 | 0.997 | 4 | 1.192 | 1.717 |
|  | 13.333 | 0.912 | 3 | 1.091 | 1.572 |
| 10 | 10 | 1.217 | 0 | 1.455 | 2.096 |
|  | 6.667 | 1.825 | 12 | 2.182 | 3.144 |
|  | 11.667 | 1.042 | 13 | 1.247 | 1.796 |
| 8.75 | 8.75 | 1.39 | 01 | 1.663 | 2.395 |
|  | 5.833 | 2.085 | 123 | 2.494 | 3.592 |
|  | 7 | 1.825 | 23 | 2.182 | 3.143 |
| 5 | 5 | 2.434 | 012 | 2.91 | 4.191 |
|  | 3.333 | 3.651 | 06 | 4.365 | 6.286 |
|  | 5.833 | 2.085 | 123 | 2.493 | 3.592 |
| 4.375 | 4.375 | 2.78 | 0123 | 3.325 | 4.79 |
|  | 2.917 | 4.17 | 12345 | 4.987 | 7.185 |
|  | 4.933 | 2.467 | 012 | 2.949 | 4.248 |
| 3.7 | 3.7 | 3.29 | 012345 | 3.392 | 5.664 |
|  | 2.467 | 4.935 | 0126 | 5.898 | 8.496 |
|  | 3.333 | 3.65 | 06 | 4.363 | 6.286 |
| 2.5 | 2.5 | 4.867 | 012345 | 5.818 | 8.382 |
|  | 1.667 | 7.3 | 0123456 | 8.727 | 12.57 |

FIG. 8

FILTER CUT-OFF FREQUENCY CORRECTION CIRCUIT

TECHNICAL FIELD OF THE INVENTION

The present invention relates to a filter cut-off frequency correction circuit, which operates in a digital manner, and more particularly, to a filter cut-off frequency correction circuit able to calculate a variation rate of the time constant distorted due to engineering variation and working conditions, and correct the cut-off frequency according to the variation rate in a digital manner.

BACKGROUND OF THE INVENTION

Electronic engineering is a technical field of transmitting, receiving, or processing signals. When undesirable signals are interfused with desired signals in signal transmission, filters, especially analog filters, are used to filter out the desired signals. Before transmitting the signals to a digital signal processing circuit, the analog filters can filter out only the signals containing desired information.

Since the cut-off frequency of a filter in an integrated circuit will be changed due to temperature variation and engineering variation, a cut-off frequency correction circuit is necessary. The cut-off frequency of the filter is dependent on a time constant of an integrator. The time constant is changed all the time due to temperature variation and engineering variation. The cut-off frequency correction is able to make the time constant be a constant value.

In an analog filter, the accuracy of the cut-off frequency is an important factor in acquiring better signal quality. When the filter is implemented by semiconductors, the cut-off frequency will be distorted ±25% at most due to engineering variation and working conditions. A Gm-C filter utilizes a phase-locked loop circuit (PLL) to adjust the cut-off frequency. In another aspect, to adjust the cut-off frequency, an active-RC filter utilizes a resistor array and/or a capacitor array to alter resistance, capacitance, or both of the resistance and capacitance.

Figure 1:
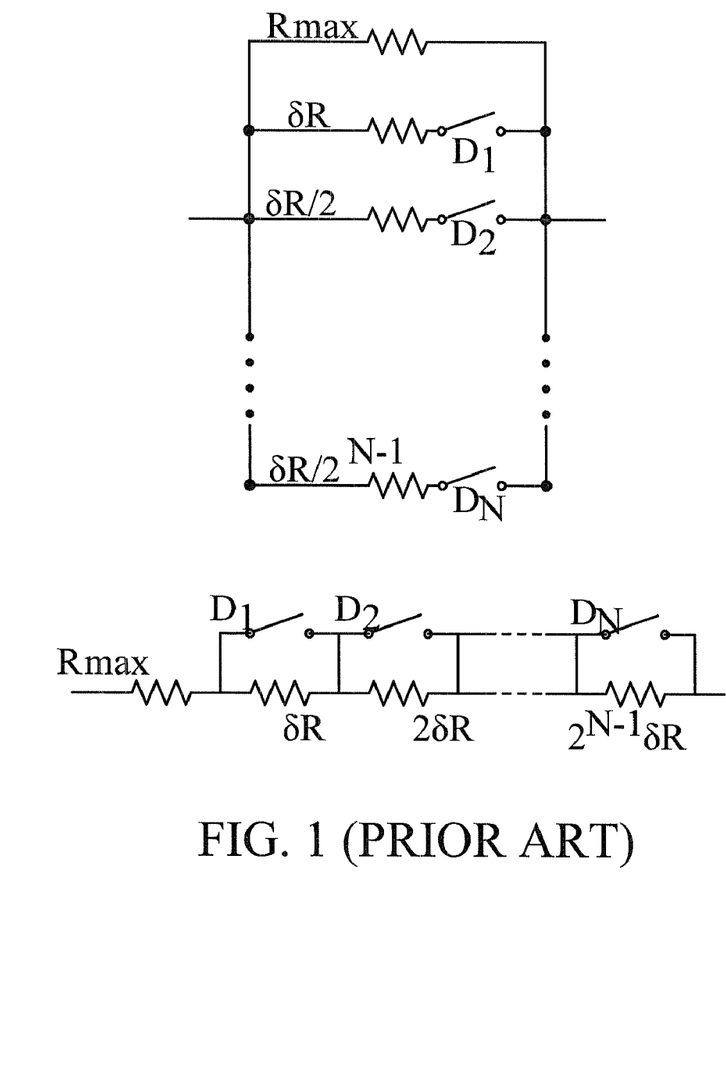
FIG. 1 is a diagram illustrating a general structure of a resistor array for adjusting the cut-off frequency of an analog filter.
Figure 2:
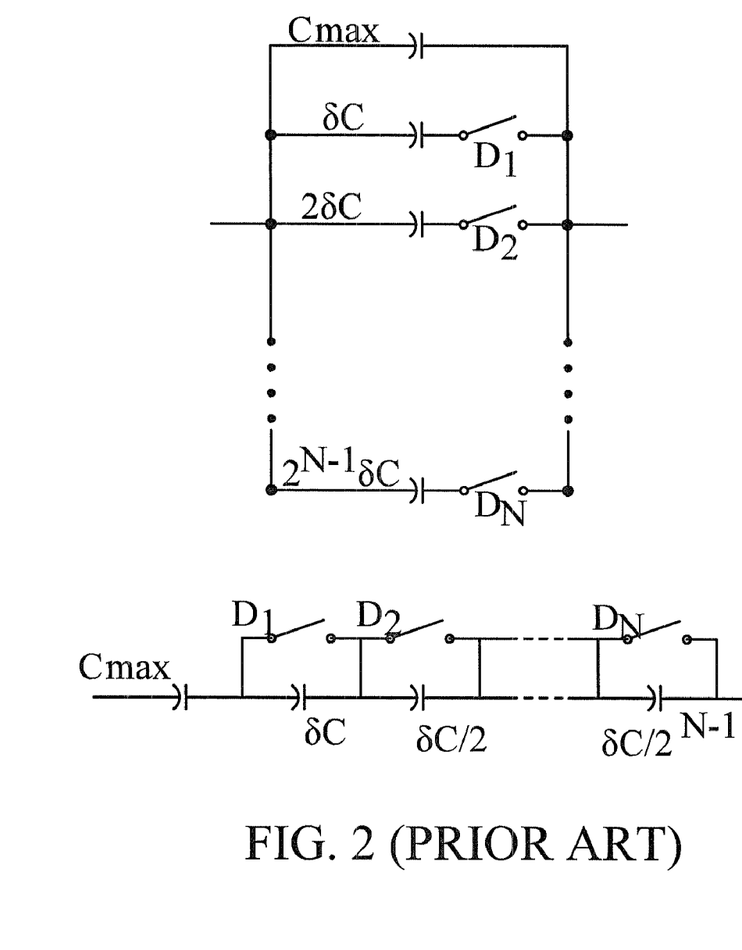
FIG. 2 is a diagram illustrating a general structure of a capacitor array for adjusting the cut-off frequency of an analog filter.

FIG. 1 is a diagram illustrating a general structure of a resistor array for adjusting the cut-off frequency of an analog filter. FIG. 2 is a diagram illustrating a general structure of a capacitor array for adjusting the cut-off frequency of an analog filter.

When the filter is manufactured for an experimental purpose, the cut-off frequency of the filter is sometimes adjusted by manually inputting a code from external to the chip. However, when the filter is for commercial use, it is necessary to add a cut-off frequency circuit capable of adjusting a distorted cut-off frequency to the original cut-off frequency inside the chip.

Nowadays, many kinds of technical schemes have been provided for the cut-off frequency correction circuits.

Figure 3A:
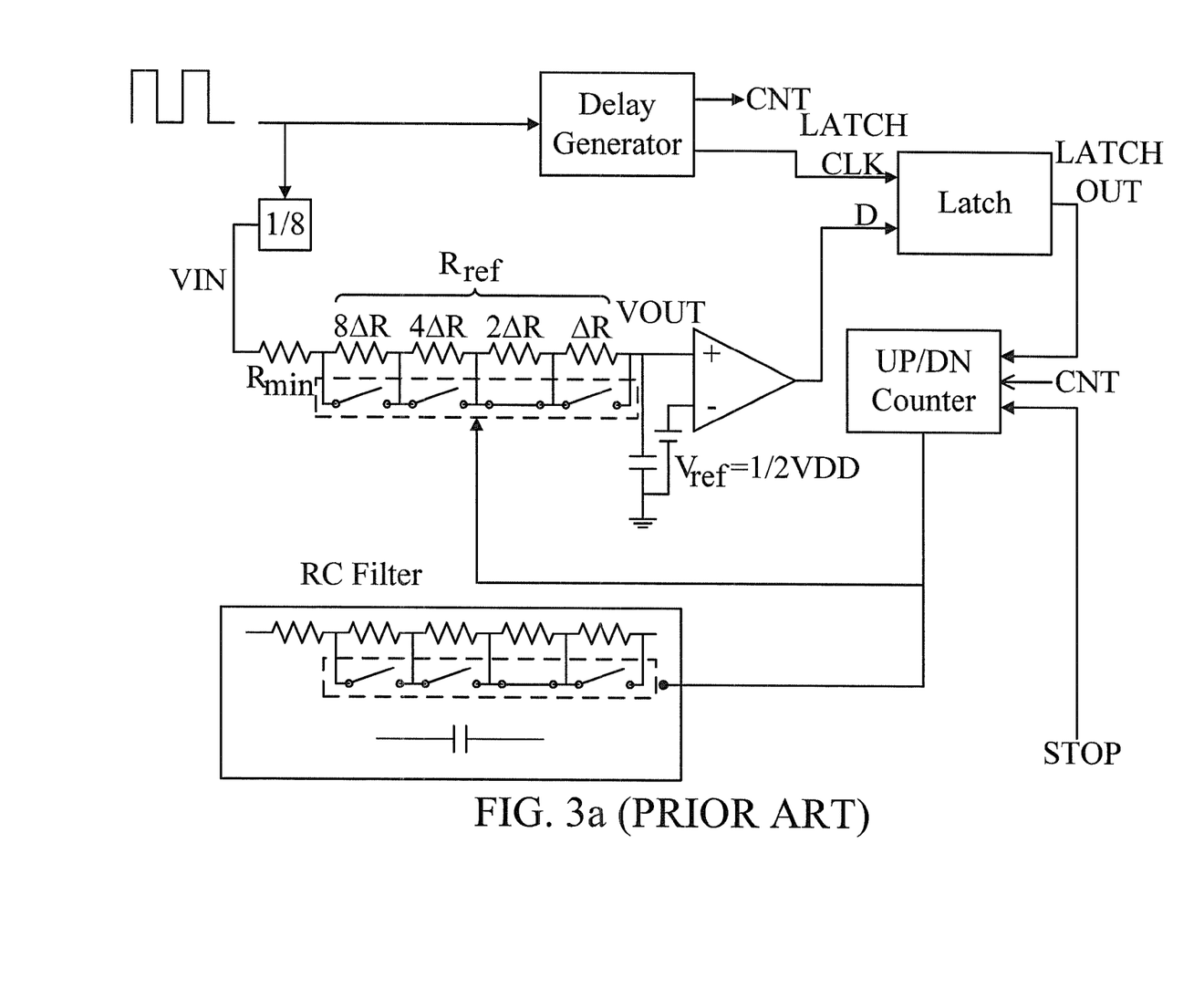
FIG. 3a is a diagram illustrating a structure of a cut-off frequency correction circuit utilizing a digital-dynamical link library (DLL).
Figure 3B:
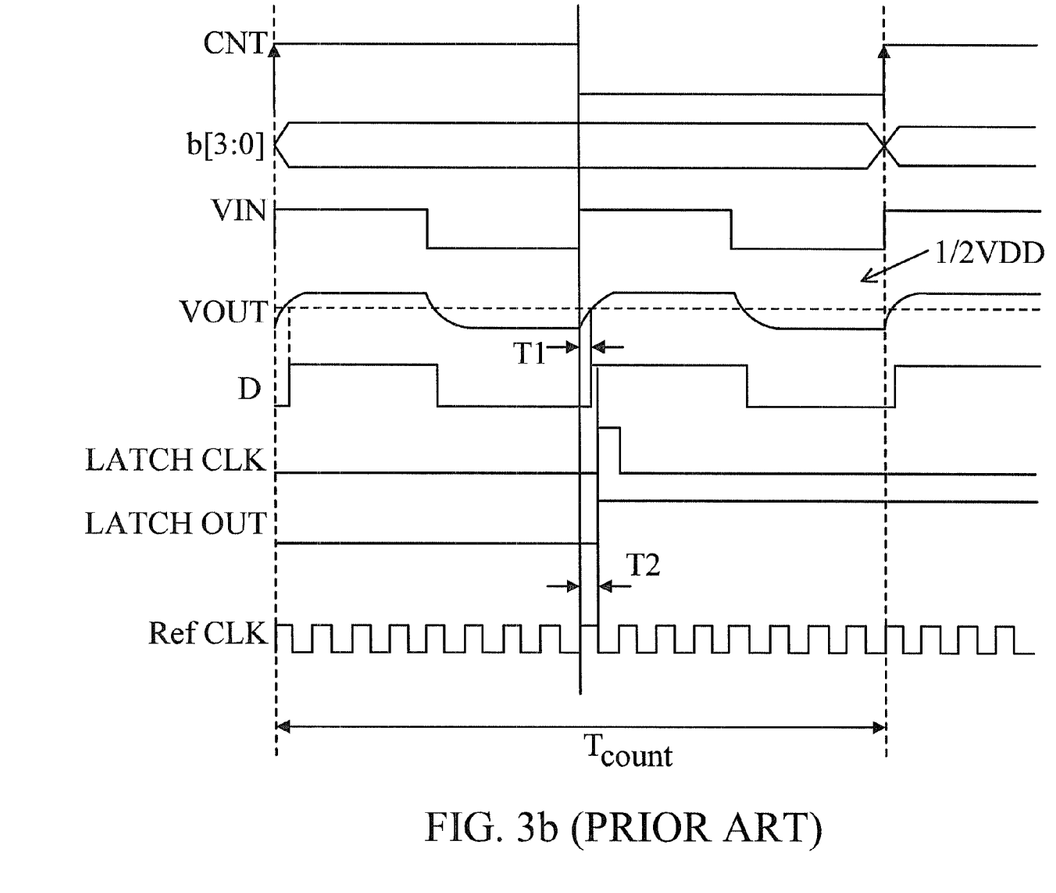

FIG. 3a is a diagram illustrating a structure of a cut-off frequency correction circuit utilizing a digital-dynamical link library (DLL). FIG. 3b is a timing chart of the cut-off frequency correction circuit in FIG. 3a.

Please refer to FIG. 3a and FIG. 3b. A clock signal (VIN) is applied to a passive filter consisted of resisters and capacitors. A comparator (CP) outputs a clock signal (D) according to the characteristics of the passive filter. The frequency of the clock signal (D) and the frequency of the clock signal (VIN) are the same, but a time delay (T1) exists therebetween. When there are no temperature variation and engineering variation, the resistance and capacitance of the passive filter is maintained at normal values, the rising edge of a LATCH CLK signal inputted from a delay generator to a latch is consistent with the rising edge of the clock signal (D) outputted from the comparator (CP). When the temperature variation and engineering variation cause the resistance and capacitance of the passive filter to be greater or smaller than the normal values, the rising edge of the clock signal (D) outputted from the comparator (CP) will lead or lag the rising edge of the LATCH CLK signal outputted from the delay generator. The difference between the rising edge positions of the clock signal (D) and the LATCH CLK signal is transmitted to an UP/DN counter. The UP/DN counter increases or decreases a bit of a resistor code each time to alter the resistance of the passive filter until the rising edge of the LATCH CLK signal outputted from the delay generator is consistent with the rising edge of the clock signal (D) outputted from the comparator (CP), and thereby the cut-off frequency is corrected.

However, in this technical scheme, the above processes need to be repeated over and over again until the desired cut-off frequency is reached. Therefore, the correction circuit would take a long time to correct the cut-off frequency.

SUMMARY OF THE INVENTION

An objective of the present invention is to provide a filter cut-off frequency correction circuit operating in a digital manner, which corrects the cut-off frequency of a filter that is distorted due to engineering variation and working conditions.

According to the above objective, the present invention provides a filter cut-off frequency correction circuit. A step function increasing from a first voltage to a second voltage is inputted. The filter cut-off frequency correction circuit comprises: a linear passive filter comprising resistors and capacitors, the linear passive filter integrating the step function to obtain a third voltage; a first comparator for comparing the third voltage and a first predetermined reference voltage, the first comparator outputting a first high-level signal when the third voltage is greater than the first predetermined reference voltage; a second comparator for outputting a second high-level signal in a first period from the time that the second voltage is applied to the time that the first comparator outputs the first high-level signal; a counter having a first input end connecting to an output end of the second comparator and a second input end connecting to a reference clock, the counter counting a number of clock pulses of the reference clock inputted in the first period; a digital block for calculating a variation rate of time constant according to the number of clock pulses of the reference clock calculated by the counter, and generating a correction code for correcting the variation rate of time constant; and a filter for correcting the cut-off frequency according to the correction code outputted from the digital block.

In the embodiment of the present invention, the digital block is able to generate the correction code according to the variation rate of time constant varied due to engineering variation and working conditions. The variation rate of time constant can be obtained by calculating at a time. Therefore, the speed of cut-off frequency adjustment can be improved. The warming-up time of a filter system is thereby shortened.

In addition, in the embodiment of the present invention, the correction code for adjusting the cut-off frequency can be calculated by the digital block. Therefore, the ratio of the cut-off frequency accuracy to the area occupied by the digital block is also improved.

BRIEF DESCRIPTION OF THE DRAWINGS

FIG. 3b is a diagram illustrating a timing chart of the cut-off frequency correction circuit in FIG. 3a.

DETAILED DESCRIPTION OF THE INVENTION

The embodiments of the present invention will be described in details in conjunction with the appending drawings. This detailed description enables a person skilled in the art to carry out the invention as described. It is noted that the present invention may be implemented as various patterns, and should not be limited to the embodiments illustrated in the specification. In order to describe the present invention clearly, unrelated parts are omitted. In the specification, the elements that have similar function or similar structure are labeled with the same reference number.

In the specification, when referring to one element that "connects" with another element, it includes not only a condition of "direct connection", but also a condition of "electrically coupling" with other elements separated therebetween. In addition, when referring to one element that "comprises" some sub-elements that constitute the element, it does not mean to exclude other constituents unless otherwise specified.

In the specification, "part", "element", and "module" all indicate a unit that can perform a process or carry out a function, and may be implemented by hardware, software, or a combination of hardware and software.

A filter cut-off frequency correction circuit implemented according to the present invention will be described in detail in conjunction with the appending drawings as follows.

Figure 4:
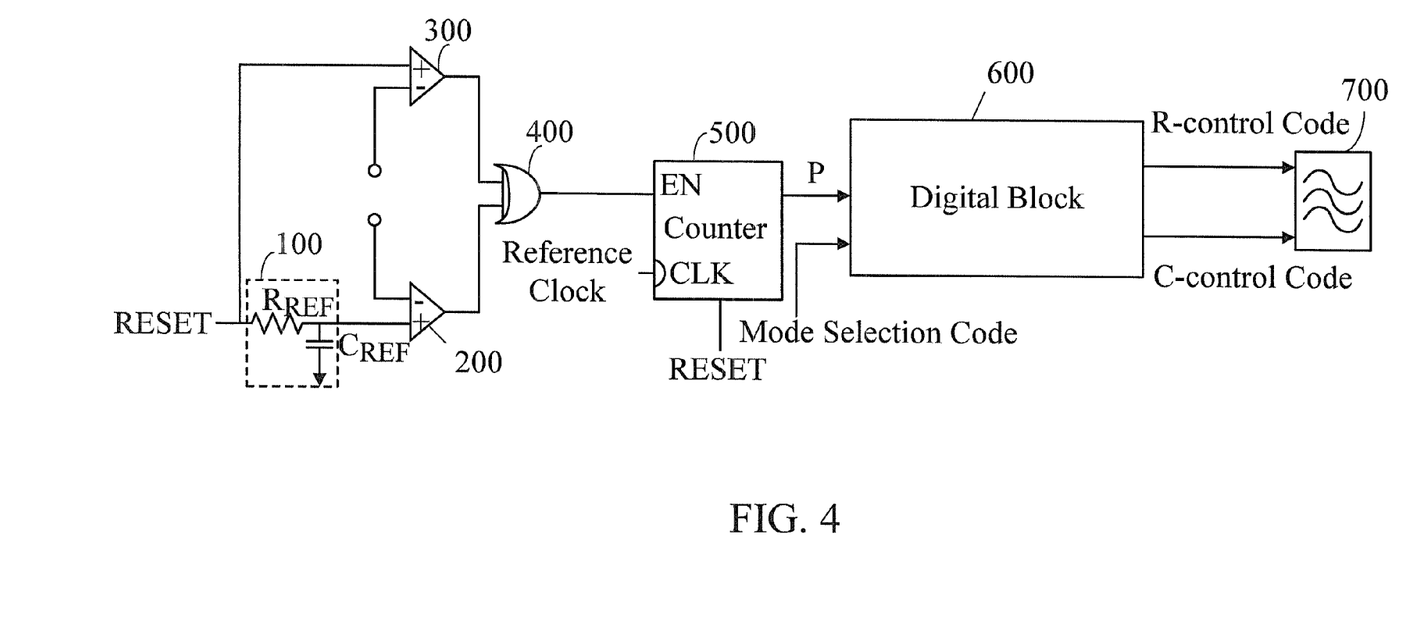
FIG. 4 is a diagram illustrating a structure of a filter cut-off frequency correction circuit operating in a digital manner according to the present invention.
Figure 5:
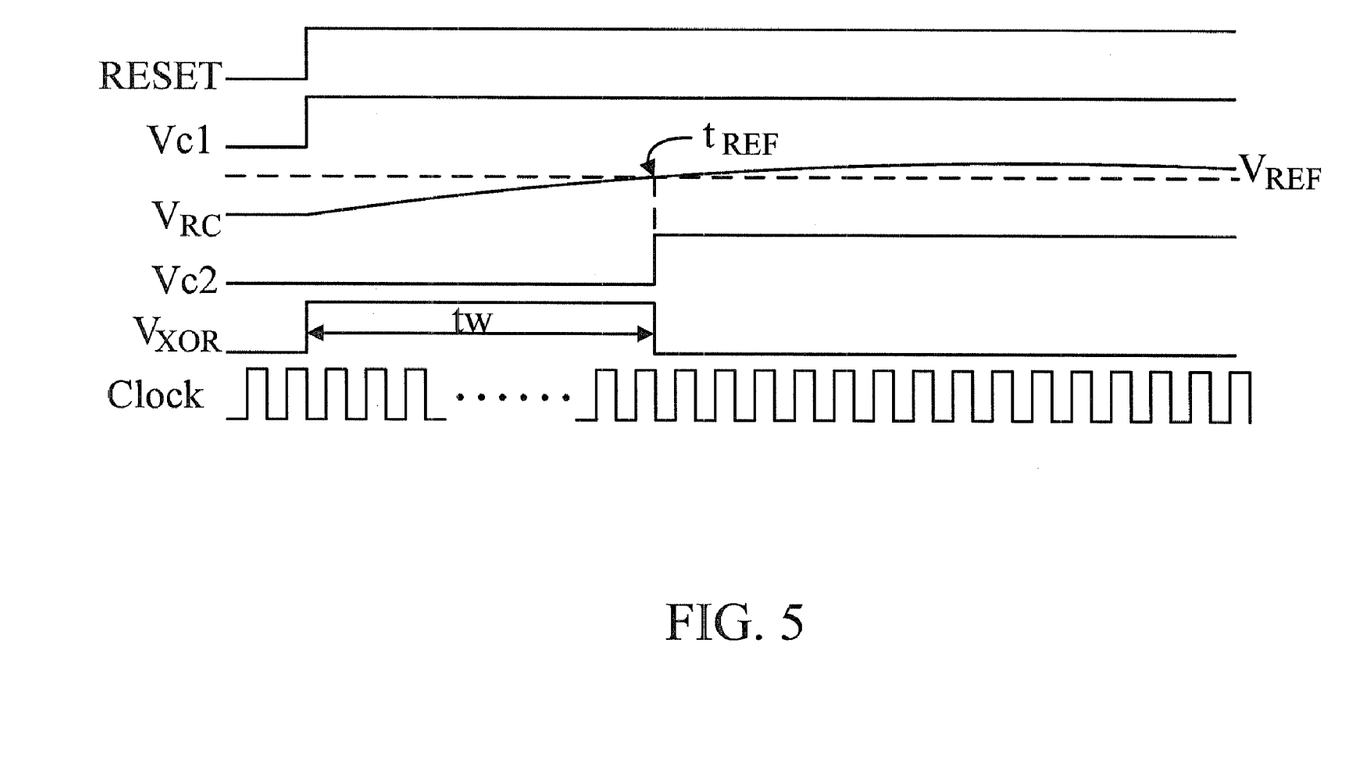
FIG. 5 is a diagram illustrating a timing chart of the filter cut-off frequency correction circuit operating in a digital manner according to the present invention.

FIG. 4 is a diagram illustrating a structure of a filter cut-off frequency correction circuit operating in a digital manner according to the present invention. FIG. 5 is a timing chart of the filter cut-off frequency correction circuit operating in a digital manner according to the present invention.

As shown in FIG. 4, the filter cut-off frequency correction circuit comprises a linear passive filter 100, a first comparator 200, a second comparator 300, a third comparator 400, a counter 500, a digital block 600, and a filter 700.

The filter 700 includes a plurality of resistors (R) and a plurality of capacitors (C). These resistors (R) may construct a linear structure or an R-2R ladder network. The present invention takes the R-2R ladder network as an example for illustration purpose. These resistors (R) and capacitors (C) are respectively connected with switches. The resistance and capacitance of the filter 700 can be altered by turning ON and OFF these switches.

The linear passive filter 100 includes a reference resistor ($R_{REF}$) and a reference capacitor ($C_{REF}$). The reference resistor ($R_{REF}$) is connected to a RESET terminal. An end of the reference capacitor ($C_{REF}$) is connected to a connection point of the reference resistor ($R_{REF}$) and the first comparator 200. The other end of the reference capacitor ($C_{REF}$) is grounded.

The linear passive filter 100 is a filter consisted of a resistor and a capacitor. The output voltage ($V_{RC}$) of the linear passive filter 100 is represented as follows:

$$V_{RC}=V_{DD}(1-e^{(-t/R_{REF}C_{REF})})\qquad\text{(Equation 1)}$$

$V_{DD}$ is a voltage that is inputted from the RESET terminal. As shown in FIG. 5, the voltage from the RESET terminal is inputted as a step function increasing from 0 to $V_{DD}$. Since the voltage inputted from the RESET terminal is a step-function voltage, the output voltage ($V_{RC}$) of the linear passive filter 100 is presented as a waveform, of which the level is gradually increasing, as shown in FIG. 5.

The first comparator 200 is an operational amplifier. The first comparator 200 has a (+) terminal that is connected to the output end of the linear passive filter 100, and a (−) terminal that is connected to a reference voltage ($V_{REF}$).

After the first comparator 200 compares the output voltage ($V_{RC}$) of the linear passive filter 100 and the reference voltage ($V_{REF}$), the first comparator 200 outputs a signal waveform as shown in FIG. 5. When the output voltage ($V_{RC}$) of the linear passive filter 100 is lower than the reference voltage ($V_{REF}$), the first comparator 200 outputs a low-level signal. When the output voltage ($V_{RC}$) of the linear passive filter 100 is greater than the reference voltage ($V_{REF}$), the first comparator 200 outputs a high-level signal.

The moment that the high-level signal is outputted from the first comparator 200 can be calculated by the following equation.

$$t=-R_{REF}C_{REF}\ln(1-V_{REF}/V_{DD})\qquad\text{(Equation 2)}$$

When the reference voltage ($V_{REF}$) is kept at a constant value, and the reference resistor ($R_{REF}$) and the reference capacitor ($C_{REF}$) of the linear passive filter 100 are assigned to specific values, the moment that the high-level signal is outputted from the first comparator 200 is thereby obtained.

The time interval between the moment that $V_{DD}$ is applied to the RESET terminal and the moment that the high-level signal is outputted from the first comparator 200 is denoted as tw. The third comparator 400 will compare the time (t) which is calculated in Equation 2 and the time interval (tw). By a comparison result form the third comparator 400, we can predict how much the reference resistor ($R_{REF}$) and the reference capacitor ($C_{REF}$) is changed due to engineering variation and working conditions.

The second comparator 300 is an operational amplifier. The second comparator 300 has a (+) terminal that is connected to the RESET terminal, and has a (−) terminal that is connected to a terminal inputted with the reference voltage ($V_{REF}$). The reference voltage ($V_{REF}$) is assigned to a voltage lower than $V_{DD}$. Therefore, when a zero voltage is applied to the RESET terminal, the second comparator 300 outputs a low-level signal. During the time that $V_{DD}$ is applied, the second comparator 300 outputs a high-level signal. $V_{DD}$ is the high voltage in the step function.

The third comparator 400 is an XOR gate. The third comparator 400 has a first input end that is connected to the first comparator 200, and a second input end that is connected to the second comparator 300.

When the output signal of the first comparator 200 and the output signal of the second comparator 300 are different in voltage, the third comparator 400 outputs a high-level signal.

As shown in FIG. 5, the third comparator 400 outputs the high-level signal in the time interval (tw). The time interval (tw) may be represented by the pulse span of the signal pulse outputted from the third comparator 400.

In the above-mentioned embodiment of the present invention, there is a comparator connected between the RESET terminal and the third comparator 400. The comparator, i.e. the second comparator 300, is identical to the first comparator 200. Therefore, the pulse span (or the time interval, tw) of the third comparator 400 will not be affected by the inherent time delay of comparators.

The counter 500 has an enable terminal (EN) that is connected to the output end of the third comparator 400, and has a clock terminal (CLK) that receives a reference clock signal.

As shown in FIG. 5, the counter 500 will count the number (P) of the inputted reference clock pulses during the pulse span (tw) of the signal pulse inputted from the third comparator 400. According to what type of the counter 500 is, an up counter or a down counter, the number (P) calculated by the counter 500 will be different.

When the counter 500 is an up counter, the up counter counts the number (P) of the reference clock pulses in the period of the pulse span (tw), and outputs the number (P) to the digital block (600).

When the counter 500 is a down counter, the down counter will estimate a reference number ($P_{RC}$) according to the reference resistor ($R_{REF}$) and reference capacitor ($C_{REF}$). For example, when a pulse span estimated according to the reference resistor ($R_{REF}$) and the reference capacitor ($C_{REF}$) is 10 μs, and the reference clock is at 40 MHz, the reference number ($P_{RC}$) estimated by the down counter will be 400. When the time constant in relation with the reference resistor ($R_{REF}$) and the reference capacitor ($C_{REF}$) is decreased due to engineering variation and working conditions, the pulse span (tw) will decrease, and thereby the number (P) outputted from the down counter is a positive number unable to reach to "0". On the contrary, when the time constant in relation with the reference resistor ($R_{REF}$) and the reference capacitor ($C_{REF}$) is increased due to engineering variation and working conditions, the pulse span (tw) will increase, and thereby the number (P) outputted from the down counter is a negative number smaller than "0".

The digital block 600 is connected to the output end of the counter 500. According to the number (P) outputted form the counter 500, the digital block 600 can calculate a variation rate of the time constant and generate a correction code for adjusting the variation rate.

The digital block 600 has two functions. One function is to determine a direction for generating the correction code in order to correct the cut-off frequency of the filter 700. The digital block 600 determines that the correction code should result in a direction to decrease the resistance and capacitance of the filter 700, or result in a direction to increase them. The other function is to determine how much of the resistance and capacitance of the filter 700 should be changed.

The digital block 600 utilizes the number (P) outputted form the counter 500 to determine the time constant in relation with the reference resistor ($R_{REF}$) and the reference capacitor ($C_{REF}$) is increased or decreased due to engineering variation and working conditions.

When the counter 500 is an up counter, the digital block 600 compares the number (P) and a reference number ($P_{REF}$) set in the digital block 600. When the number (P) is greater than the reference number ($P_{REF}$), the digital block 600 determines the time constant is increased, and selects a direction to decrease the resistance and capacitance of the filter 700. When the number (P) is smaller than the reference number ($P_{REF}$), the digital block 600 determines the time constant is decreased, and selects a direction to increase the resistance and capacitance of the filter 700. The digital block 600 also generates the correction code for eliminating the difference between the number (P) and the reference number ($P_{REF}$).

In another instance, the counter 500 is a down counter. When the number (P) is a positive number, the digital block 600 determines the time constant is decreased, and selects a direction to increase the resistance and capacitance of the filter 700. When the number (P) is a negative number, the digital block 600 determines the time constant is increased, and selects a direction to decrease the resistance and capacitance of the filter 700.

The digital block 600 can calculate a variation rate of the time constant varied due to engineering variation and working conditions by the following equation.

$$\frac{P}{P_{RC}} * 100 = a\% \quad \text{(Equation 3)}$$

where $P_{RC}$ is a reference number set in the down counter.

Next, the digital block 600 utilizes the variation rate of the time constant (a %) to calculate a correction value for the resistance and capacitance of the filter 700 by the following equation.

$$R_{nor}C_{nor}\left(1 \pm \frac{a}{100}\right)\left(1 m \frac{m}{100}\right) = R_{nor}C_{nor} \quad \text{(Equation 4)}$$

In addition, the digital block 600 generates the correction code that makes the resistance and capacitance of the filter 700 to increase or decrease m %, and outputs the correction code to the filter 700. The cut-off frequency of the filter 700 is corrected by altering the resistance and capacitance of the filter 700 according to the correction code outputted from the digital block 600.

Figure 6:
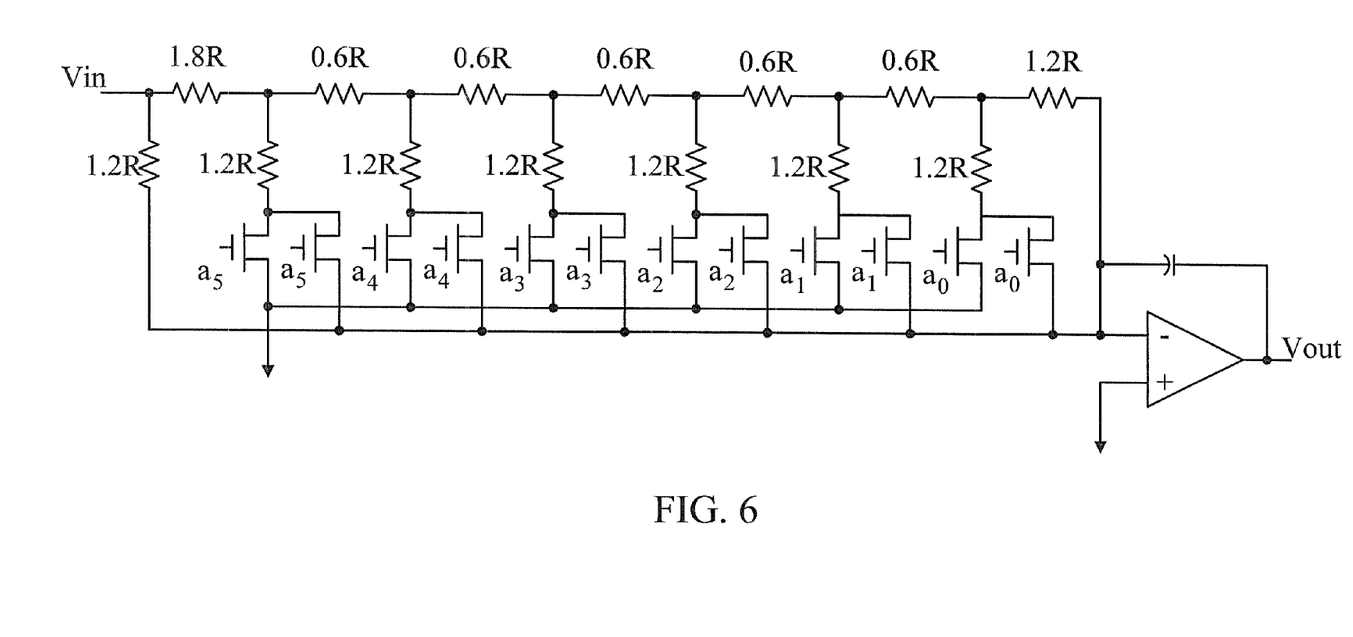
FIG. 6 is a diagram illustrating a structure of a resistor array of the filter 700 implemented according to the present invention.

FIG. 6 is a diagram illustrating a structure of a resistor array of the filter 700 implemented according to the present invention.

As shown in FIG. 6, the resistors (R) of the filter 700 constructs an R-2R ladder network. The correction value (Reff), which depends on the resistance and the correction code (code), is calculated by the following equation.

$$R_{eff} = \frac{1.2}{1 + 0.25 \times \frac{code + 1}{2^5}} \quad \text{(Equation 5)}$$

In the presence of a default code, the correction code (code) that makes the resistance to increase or decrease m % is shown as the following equation.

$$\frac{1.2R}{1 + 0.25 \times \frac{(\text{default code}) + 1}{2^5}}\left(1 + \frac{m}{100}\right) = \quad \text{(Equation 6)}$$

$$\frac{1.2R}{1 + 0.25 \times \frac{code + 1}{2^5}}$$

In Equation 6, the "code" represents the correction code for the resistance of the filter 700. A correction table for calculating the resistance according to the correction value (m) is installed in the digital block 600.

Figure 7:
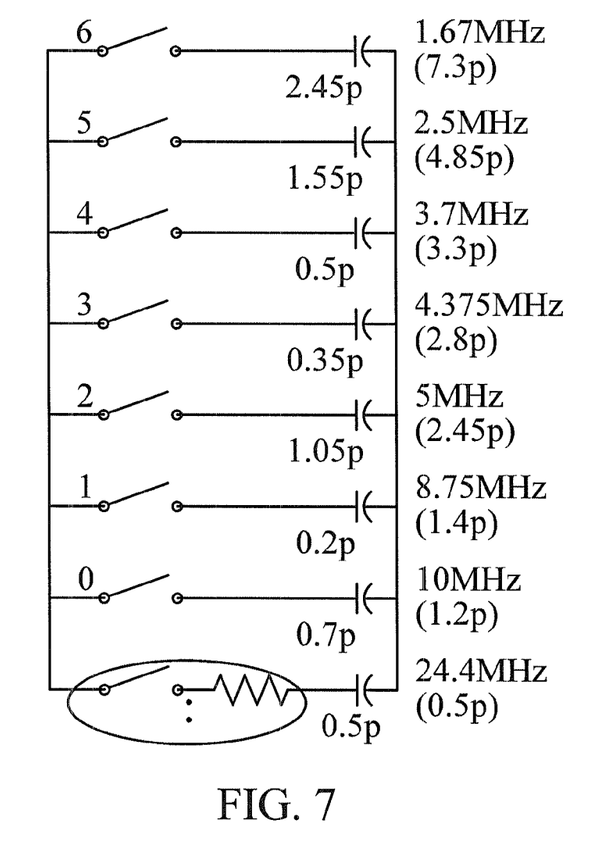
FIG. 7 is a diagram illustrating a structure of a capacitor array of the filter 700 implemented according to the present invention.
Figure 8:
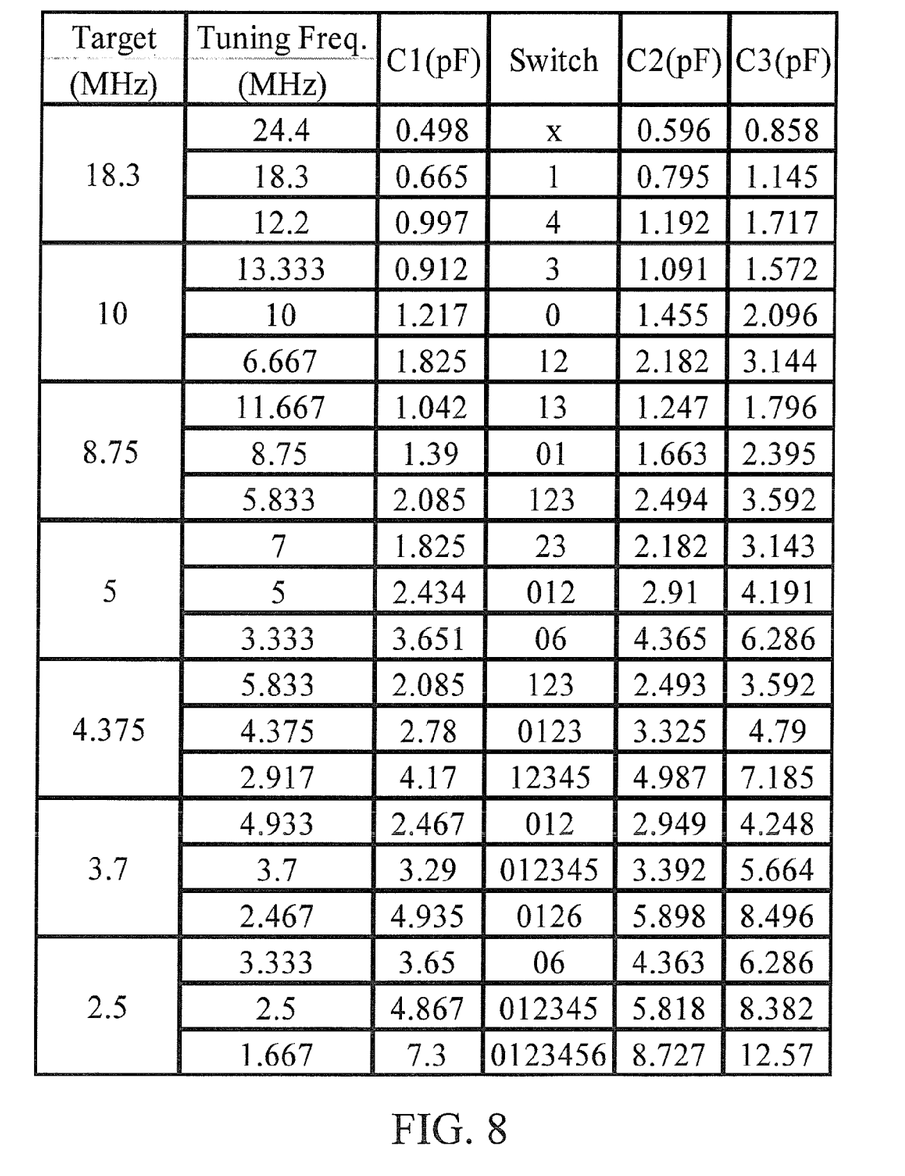
FIG. 8 is a diagram illustrating a correction table for capacitors implemented according to the present invention.

FIG. 7 is a diagram illustrating a structure of a capacitor array of the filter 700 implemented according to the present invention. FIG. 8 is a diagram illustrating a correction table for capacitors implemented according to the present invention.

As shown in FIG. 7, the capacitors are connected in parallel and each capacitor is connected to a switch. A table shown in FIG. 8 is installed in the digital block 600 so that the correction code for the capacitor (C) can be calculated according to the correction value (m).

More specifically, the switches in FIG. 7 are labeled with switch numbers in FIG. 8. The switch numbers that are listed in FIG. 8 represent that the corresponding switches are turned ON. The digital block 600 generates the correction code by selecting some switches to be turned ON or OFF according to the correction value (m) so as to alter the capacitance of the filter 700.

In the above-mentioned embodiment of the present invention, the characteristics of the resistor (R) and capacitor (C) of the filter 700 make it able to selectively increase or decrease the resistance and capacitance. For instance, it can increase or decrease the resistance only. It can increase or decrease the capacitance only. It also can increase or decrease both the resistance and capacitance.

Above all, the above-mentioned embodiment of the present invention makes the time constant to keep at a constant value to correct the cut-off frequency of the filter 700.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A filter cut-off frequency correction circuit for correcting a cut-off frequency of a filter, the cut-off frequency correction circuit being inputted with a step function increasing from a first voltage to a second voltage, the cut-off frequency correction circuit comprising:

a linear passive filter comprising a resistor and a capacitor, the linear passive filter integrating the step function to obtain a third voltage;

a first comparator having one terminal connected to an output end of the linear passive filter for receiving the third voltage and another terminal inputted with a first predetermined reference voltage, the first comparator comparing the third voltage and the first predetermined reference voltage, the first comparator outputting a first high-level signal when the third voltage is greater than the first predetermined reference voltage;

a second comparator coupled with the linear passive filter and the first comparator, for outputting a second high-level signal in a first period from the time that the second voltage is applied to the linear passive filter to the time that the first comparator outputs the first high-level signal;

a counter having a first input end connected to an output end of the second comparator for receiving the second high-level signal and a second input end inputted with a reference clock, the counter counting a number of clock pulses of the reference clock inputted during the first period;

a digital block for calculating a variation rate of time constant of the linear passive filter according to the number of clock pulses of the reference clock calculated by the counter to generate a correction code for correcting the variation rate of time constant, in which the correction code is outputted to the filter for correcting its cut-off frequency.

2. The filter cut-off frequency correction circuit of claim 1, further comprising a third comparator connected between the linear passive filter and the second comparator, the third comparator having one terminal connected to an input end of the linear passive filter and another terminal inputted with a second predetermined reference voltage, the input end of the linear passive filter receiving the step-function voltage, the second predetermined reference voltage being assigned to a voltage lower than the second voltage such that the third comparator outputs a third high-level signal when the second voltage is applied to the linear passive filter.

3. The filter cut-off frequency correction circuit of claim 1, wherein the counter is an up counter.

4. The filter cut-off frequency correction circuit of claim 3, wherein the digital block determines as to the time constant of the linear passive filter is increased when the number of clock pulses of the reference clock is greater than a predetermined reference number, the digital block determines as to the time constant of the linear passive filter is decreased when the number of clock pulses of the reference clock is smaller than the predetermined reference number, and the digital block generates the correction code for eliminating the difference between the number of clock pulses of the reference clock and the predetermined reference number.

5. The filter cut-off frequency correction circuit of claim 1, wherein the counter is a down counter, and the down counter counts down from a reference number calculated according to the resistors and the capacitor of the linear passive filter.

6. The filter cut-off frequency correction circuit of claim 5, wherein the digital block determines as to the time constant of the linear passive filter is decreased when the number of clock pulses of the reference clock outputted from the counter is a positive number, and the digital block determines as to the time constant of the linear passive filter is increased when the number of clock pulses of the reference clock outputted from the counter is a negative number.

7. The filter cut-off frequency correction circuit of claim 1, wherein the resistor and the capacitor of the linear passive filter are located in the same environment as the filter.

8. The filter cut-off frequency correction circuit of claim 1, wherein the second comparator is an XOR gate.

* * * * *